(12) United States Patent
Wu (10) Patent No.: US 11,929,280 B2
(45) Date of Patent: Mar. 12, 2024

(54) CONTACT WINDOW STRUCTURE AND METHOD FOR FORMING CONTACT WINDOW STRUCTURE

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 236 days.

(21) Appl. No.: 17/396,910

(22) Filed: Aug. 9, 2021

(65) Prior Publication Data

US 2022/0093454 A1    Mar. 24, 2022

Related U.S. Application Data

(63) Continuation of application No. PCT/CN2021/099878, filed on Jun. 11, 2021.

(30) Foreign Application Priority Data

Sep. 22, 2020 (CN) .......................... 202011000651.2

(51) Int. Cl.
  *H01L 21/768*  (2006.01)
  *H01L 23/48*  (2006.01)

(52) U.S. Cl.
  CPC .. *H01L 21/76804* (2013.01); *H01L 21/76814* (2013.01); *H01L 21/76879* (2013.01); *H01L 23/481* (2013.01)

(58) Field of Classification Search
  CPC ......... H01L 21/76804; H01L 21/76814; H01L 21/76879; H01L 21/76816; H01L 23/481; H01L 23/5226
  See application file for complete search history.

(56) References Cited

U.S. PATENT DOCUMENTS 4,641,420 A * 2/1987 Lee ................... H01L 21/76831
                                              257/E21.585
5,285,110 A    2/1994 Bae
                  (Continued)

FOREIGN PATENT DOCUMENTS

CN    1467826 A    1/2004
CN    1204606 C    6/2005
              (Continued)

OTHER PUBLICATIONS

Supplementary European Search Report in the European application No. 21773256.9, dated Apr. 12, 2022, 9 pgs.

(Continued)

*Primary Examiner* — Shahed Ahmed
*Assistant Examiner* — Vicki B. Booker
(74) *Attorney, Agent, or Firm* — Cooper Legal Group, LLC (57) ABSTRACT

A contact window structure and a method for forming the contact window structure are provided. The method includes: an etching spacer is formed on a surface of a target layer, and a dielectric layer covering a substrate, the target layer and the etching spacer is formed; the dielectric layer is etched to form an etching hole in the dielectric layer, a bottom of the etching hole exposing a top surface of the etching spacer; and the etching spacer is removed along the etching hole to form an etching channel communicating with the etching hole, the etching channel exposing a portion of the surface of the target layer and constituting a contact window structure with the etching hole.

13 Claims, 7 Drawing Sheets

(56) References Cited

U.S. PATENT DOCUMENTS

| | | |
|---|---|---|
| 5,320,980 A | 6/1994 | Bae |
| 6,136,695 A | 10/2000 | Lee |
| 6,812,577 B2 | 11/2004 | Lee |
| 7,026,207 B2 | 4/2006 | Tsai |
| 7,041,605 B2 | 5/2006 | Lee |
| 7,259,087 B2 | 8/2007 | Jung |
| 7,829,410 B2 | 11/2010 | Plum |
| 8,039,377 B2 | 10/2011 | Plum |
| 8,299,574 B2 | 10/2012 | Plum |
| 8,372,724 B2 | 2/2013 | Takaishi |
| 8,395,235 B2 | 3/2013 | Tsuchiya |
| 8,871,633 B2 | 10/2014 | Fukasawa |
| 9,076,804 B2 | 7/2015 | Liao et al. |
| 9,230,966 B2 | 1/2016 | Sapra et al. |
| 9,293,411 B2 | 3/2016 | Fukasawa |
| 9,425,142 B2 | 8/2016 | Fukasawa |
| 9,627,359 B2 | 4/2017 | Fukasawa |
| 9,859,214 B2 | 1/2018 | Fukasawa |
| 9,871,052 B2 | 1/2018 | Lee |
| 9,941,206 B2 | 4/2018 | Kang |
| 9,978,677 B2 | 5/2018 | Liu |
| 10,037,918 B2 | 7/2018 | Hsu et al. |
| 10,157,837 B2 | 12/2018 | Fukasawa |
| 10,504,839 B2 | 12/2019 | Fukasawa |
| 10,622,305 B2 | 4/2020 | Kang |
| 2002/0093105 A1* | 7/2002 | Jeon ............... H01L 21/76804 257/E21.578 |
| 2004/0002189 A1 | 1/2004 | Park |
| 2004/0046251 A1 | 3/2004 | Lee |
| 2004/0197986 A1 | 10/2004 | Tsai |
| 2004/0245650 A1 | 12/2004 | Lee |
| 2005/0042878 A1 | 2/2005 | Jung |
| 2009/0134491 A1 | 5/2009 | Plum |
| 2010/0295110 A1 | 11/2010 | Takaishi |
| 2011/0018098 A1 | 1/2011 | Plum |
| 2011/0062552 A1 | 3/2011 | Tsuchiya |
| 2012/0001299 A1 | 1/2012 | Plum |
| 2013/0082401 A1 | 4/2013 | Fukasawa |
| 2014/0210087 A1 | 7/2014 | Kang |
| 2015/0008591 A1 | 1/2015 | Fukasawa |
| 2015/0054163 A1 | 2/2015 | Liao et al. |
| 2015/0294971 A1 | 10/2015 | Sapra et al. |
| 2015/0357313 A1 | 12/2015 | Fukasawa |
| 2016/0013191 A1 | 1/2016 | Sapra et al. |
| 2016/0307877 A1 | 10/2016 | Fukasawa |
| 2017/0110473 A1 | 4/2017 | Lee |
| 2017/0117218 A1 | 4/2017 | Liu |
| 2017/0207163 A1 | 7/2017 | Fukasawa |
| 2018/0068899 A1 | 3/2018 | Tapily et al. |
| 2018/0076126 A1 | 3/2018 | Fukasawa |
| 2018/0090511 A1 | 3/2018 | Nakajima |
| 2018/0151560 A1 | 5/2018 | Hsu et al. |
| 2018/0197815 A1 | 7/2018 | Kang |
| 2018/0294225 A1 | 10/2018 | Lee et al. |
| 2019/0080997 A1 | 3/2019 | Fukasawa |
| 2020/0020711 A1 | 1/2020 | Liao |
| 2020/0027827 A1 | 1/2020 | Lin et al. |

FOREIGN PATENT DOCUMENTS

| | | |
|---|---|---|
| CN | 1956184 A | 5/2007 |
| CN | 101874303 A | 10/2010 |
| CN | 103094186 A | 5/2013 |
| CN | 103972158 A | 8/2014 |
| CN | 104347345 A | 2/2015 |
| CN | 104425567 A | 3/2015 |
| CN | 104658962 A | 5/2015 |
| CN | 104979163 A | 10/2015 |
| CN | 106611742 A | 5/2017 |
| CN | 108122845 A | 6/2018 |
| CN | 108695336 A | 10/2018 |
| CN | 109037214 A | 12/2018 |
| CN | 109273430 A | 1/2019 |
| CN | 211017076 U | 7/2020 |
| KR | 20050066369 A | 6/2005 |
| KR | 20080093738 A | 10/2008 |
| WO | 2018063337 A1 | 4/2018 |

OTHER PUBLICATIONS

International Search Report in the international application No. PCT/CN2021/099873, dated Aug. 4, 2021, 3 pgs.
International Search Report in the international application No. PCT/CN2021/100740, dated Sep. 15, 2021, 3 pgs.
International Search Report in the international application No. PCT/CN2021/099878, dated Sep. 13, 2021, 2 pgs.
International Search Report in the international application No. PCT/CN2021/100699, dated Aug. 31, 2021, 2 pgs.

* cited by examiner

CONTACT WINDOW STRUCTURE AND METHOD FOR FORMING CONTACT WINDOW STRUCTURE

CROSS-REFERENCE TO RELATED APPLICATIONS

The present application is a continuation application of International Patent Application No. PCT/CN2021/099878, filed on Jun. 11, 2021 and entitled "Contact Window Structure and Method for Forming Contact Window Structure", which claims priority to Chinese Patent Application No. 202011000651.2, filed on Sep. 22, 2020 and entitled "Contact Window Structure and Method for Forming Contact Window Structure". The contents of International Patent Application No. PCT/CN2021/099878 and Chinese Patent Application No. 202011000651.2 are hereby incorporated by reference in their entireties.

TECHNICAL FIELD

The present application relates to the field of semiconductors, and in particular to a contact window structure and a method for forming the contact window structure.

BACKGROUND

As integrated circuits have evolved to very-large-scale integrated circuits, the density of circuits in integrated circuits has increased and the number of components involved has increased, which has prevented a wafer surface from providing sufficient area to manufacture required interconnection lines.

In order to meet the requirements for interconnection lines after component reduction, the design of multi-layer metal interconnection lines with two or more layers becomes a common method for a very-large-scale integrated circuit technology. At present, the conduction of different metal layers or a metal layer and a spacer layer may be realized by a metal plug. The formation of the metal plug includes: forming a target metal layer in a substrate, in which the target metal layer is flush with a surface of the substrate; forming a dielectric layer on the substrate and the target metal layer; forming a through hole (or a contact window structure) exposing a surface of the target metal layer in the dielectric layer; and filling the through hole (or the contact window structure) with metal to form the metal plug.

As the integration level of devices is getting higher, an aspect ratio of the through hole formed in the dielectric layer is also continuously improved. The through hole with a high aspect ratio is always a great challenge for an etching process. When the through hole with the high aspect ratio is etched in the related art, there may be a problem that the surface of the target metal layer is not exposed from the bottom of the formed through hole (that the target metal layer is not windowed) or a problem that the surface of the target metal layer is exposed from the bottom of the through hole but a dimension of a top of the through hole is large and the target metal layer may be over-etched or broken down.

SUMMARY

The technical problems to be solved by the present application are how to prevent the problem of not windowing during the formation of a contact window structure with a high aspect ratio and the problem that a dimension of a top of the contact window structure is large and a target metal layer may be over-etched or broken down.

The present application provides a method for forming a contact window structure of a semiconductor device. The method may include:

a substrate is provided, the substrate being provided with at least one target layer formed in the substrate and exposing a surface of the target layer;

at least one etching spacer is formed on the surface of the target layer;

a dielectric layer covering the substrate, the target layer and the etching spacer is formed;

the dielectric layer is etched to form an etching hole in the dielectric layer, a bottom of the etching hole exposing a top surface of the etching spacer, a dimension of the bottom of the etching hole being smaller than a dimension of a top of the etching spacer; and the etching spacer is removed along the etching hole to form an etching channel communicating with the etching hole, the etching channel exposing a portion of the surface of the target layer and constituting the contact window structure with the etching hole.

The present application also provides a contact window structure of a semiconductor device, the semiconductor device including a substrate, a dielectric layer and the contact window structure in the dielectric layer. The substrate is provided with a target layer formed in the substrate and exposes a surface of the target layer. The dielectric layer is located on the substrate and the target layer. The contact window structure includes an etching hole and an etching channel communicating with the etching hole, the etching hole being located above the etching channel, the etching channel exposing a portion of the surface of the target layer, the etching channel being formed by removing an etching spacer on the surface of the target layer after the etching hole is formed in the dielectric layer.

DETAILED DESCRIPTION

As described in background, when a through hole with a high aspect ratio is etched in the related art, there may be a problem that a surface of a target metal layer is not exposed from a bottom of the formed through hole (that the target metal layer is not windowed) or a problem that the surface of the target metal layer is exposed from the bottom of the through hole but a dimension of a top of the through hole is large and the target metal layer may be over-etched or broken down.

Figure 1:
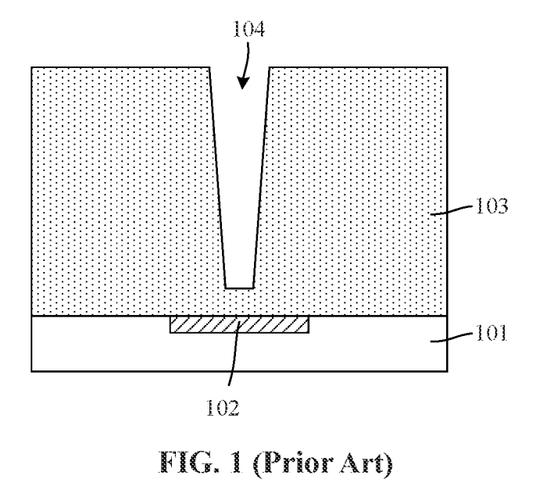
FIG. 1 to FIG. 3 are schematic diagrams of a through hole formed in the related art.
Figure 2:
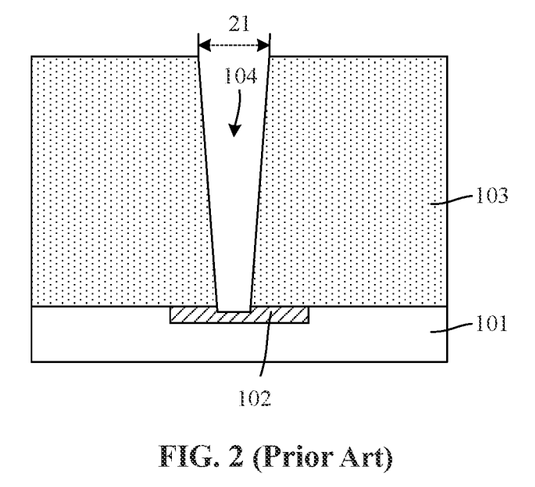

It has been found that referring to FIG. 1, during a formation of a through hole 104 with a high aspect ratio by etching a dielectric layer 103, the through hole 104 is usually etched down to obtain a larger critical dimension of a top of the through hole 104 and a smaller critical dimension of a bottom of the through hole 104. During the miniature, the problem that a target metal layer 102 is not windowed (a bottom of the through hole 104 does not expose a surface of the corresponding target metal layer 102) may occur. If the etching strength is increased for this reason, a critical dimension 21 of the top of the through hole is enlarged (referring to FIG. 2), and the target metal layer 102 may be at risk of being broken down, or there may be significant over-etching damage marks.

Figure 3:
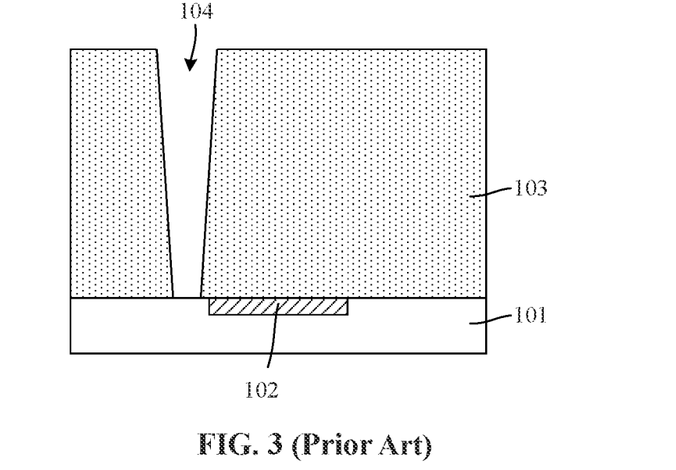

In addition, referring to FIG. 3, it is possible that the formed through hole 104 is offset from the target metal layer due to design layout limitations or offset errors of a lithography process, etc.

To this end, the present application provides a contact window structure of a semiconductor device and a method for forming the contact window structure of the semiconductor device. The method includes: at least one etching spacer is formed on a surface of at least one target layer, and a dielectric layer covering a substrate, the target layer and the etching spacer is formed; the dielectric layer is etched to form an etching hole in the dielectric layer, a bottom of the etching hole exposing a top surface of the etching spacer; and the etching spacer is removed along the etching hole to form an etching channel communicating with the etching hole, the etching channel exposing a portion of the surface of the target layer and constituting a contact window structure with the etching hole. Due to a support effect of the etching spacer, when the contact window structure with the same depth as the existing contact window structure is formed, the depth of the etching hole formed in the present application can be reduced, When the etching hole with a smaller depth is formed, the etching spacer can be used as an etching stop layer, so that a problem of not windowing can be prevented, and a problem of increasing etching strength does not exist during formation of a contact window structure. Therefore, a dimension of a top of the etching hole cannot be increased and can be kept consistent with a designed dimension, and the etching difficulty for forming the etching hole can be reduced. Moreover, since the height of the etching spacer is smaller than the depth of the contact window structure to be formed, an etching load for removing the etching spacer is smaller, and excessive over-etching will not be brought to the target layer.

In order that the above objects, features, and advantages of the present application may be more readily understood, specific implementations of the present application will now be described in detail with reference to the accompanying drawings. In the detailed description of the embodiments of the present application, for convenience of description, the schematic diagram will be partially enlarged not according to an ordinary ratio, and the schematic diagram is only an example, which should not limit the protection scope of the present application. In addition, three-dimensional space dimensions of length, width, and depth should be included in actual production.

Figure 4:
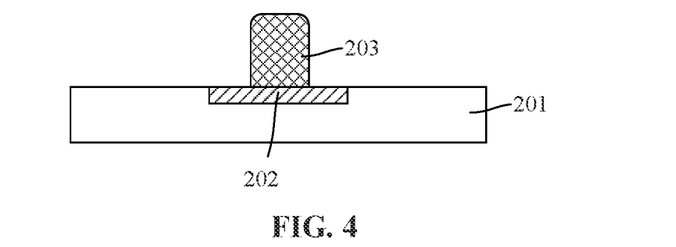
FIG. 4 to FIG. 16 are schematic cross-sectional diagrams of a forming process of a contact window structure according to an embodiment of the present application.

Referring to FIG. 4, a substrate 201 is provided. A target layer 202 is formed in the substrate 201. The substrate 201 exposes a surface of the target layer 202. An etching spacer 203 is formed on the surface of the target layer 202.

In an embodiment, the substrate 201 may be a semiconductor substrate. The target layer 202 may be a doped region located in the semiconductor substrate (such as a region doped with N-type impurity ions or doped with P-type impurity ions), or a metal silicide region located in the semiconductor substrate (such as a nickel silicide region or a cobalt silicide region). The semiconductor substrate may be made of Silicon (Si), Germanium (Ge), Silicon Germanium (GeSi), Silicon Carbide (SiC), Silicon-on-Insulator (SOI), Germanium-on-Insulator (GOI), or other materials, e.g. III-V compounds such as gallium arsenide.

In other embodiments, the substrate 201 may include a semiconductor substrate and an interlayer dielectric layer located in the semiconductor substrate. The target layer 202 is located in the interlayer dielectric layer. The interlayer dielectric layer may be a single-layer structure or a multi-layer stacked structure. The target layer 202 may be a metal layer that may be connected to a conductive structure (such as a conductive plug) formed in an underlying dielectric layer.

The surface of the target layer 202 may be flush with a surface of the substrate 201 or may be slightly above a surface of the substrate 201.

One or more (greater than or equal to 2) target layers 202 may be formed in the substrate 201. When there are a plurality of target layers 202, adjacent target layers are discrete. Only one target layer 202 in the substrate 201 is illustrated as an example in the present embodiment.

The etching spacer 203 is formed on the surface of the target layer 202. After a dielectric layer is formed through the etching spacer 203 and an etching hole exposing a top surface of the etching spacer is formed in the dielectric layer, when the etching spacer 203 is removed, an etching channel communicating with the etching hole may be formed. The etching channel and the etching hole constitute a contact window structure exposing the surface of the target layer. Due to a support effect of the etching spacer 203, when the contact window structure with the same depth as the existing contact window structure is subsequently formed, the depth of the etching hole formed in the present application can be reduced. When the etching hole with a smaller depth is formed, the etching spacer can be used as an etching stop layer, so that a problem of not windowing can be prevented, and a problem of increasing etching strength does not exist during formation of a contact window structure. Therefore, a dimension of a top of the etching hole cannot be increased and can be kept consistent with a designed dimension, and the etching difficulty for forming the etching hole can be reduced. Moreover, since the height of the etching spacer is smaller than the depth of the contact window structure to be formed, an etching load for removing the etching spacer is smaller, and excessive over-etching will not be brought to the target layer.

In an embodiment, the dimension of the formed etching spacer may be larger than the dimension of the bottom of the etching hole, so that after the etching spacer is removed, the dimension of the bottom of the contact window structure is increased. When a metal plug is formed in the contact window structure, the metal plug and the bottom target layer have a larger contact area, and thus the contact resistance is reduced. In addition, the etching spacer is arranged to extend laterally relative to the target layer. Thus, even if the position of the etching hole formed in the dielectric layer is slightly offset due to design layout limitations, the bottom of the etching hole still exposes a portion of the surface of the etching spacer, so that the etching hole communicates with an etching channel formed after the etching spacer is removed. The metal plug connected to the target layer can still be formed in the contact window structure.

In an embodiment, the operation that the etching spacer 203 is formed includes the following operations. An etching spacer material layer (not shown) is formed on the target layer 202 and the substrate 201; and the etching spacer material layer is patterning to form the etching spacer 203 on the target layer 202.

The material of the etching spacer 203 and the material of the subsequently formed dielectric layer are different from each other, so that the dielectric layer has a higher etching selectivity (greater than or equal to 2:1) than the etching spacer when the dielectric layer is subsequently etched to form the etching hole. Therefore, the etching spacer may serve as a stop layer when the etching hole is formed. The etching spacer has a higher etching selectivity (greater than or equal to 4:1) than the dielectric layer when the etching spacer is subsequently removed, so as to prevent the dimension change of the formed etching hole or a small change of the formed etching hole.

In an embodiment, the etching spacer 203 is made of one or more of silicon nitride, silicon oxide, silicon carbonitride, silicon oxynitride, polycrystalline silicon, amorphous silicon, or amorphous carbon. In the present embodiment, the etching spacer 203 is made of silicon nitride.

In an embodiment, a height of the etching spacer 203 is 1%-30% of a depth of the subsequently formed dielectric layer (or a depth of the contact window structure). Specifically, the height of the etching spacer 203 may be 2%, 5%, 10%, 15%, 20%, or 25% of the depth of the subsequently formed dielectric layer (or the depth of the contact window structure). At the specific ratios described above, it is less difficult to subsequently form the etching hole in the dielectric layer, and the accuracy of the top dimension of the etching hole is easier to control.

In the present embodiment, there is one target layer 202, the etching spacer 203 is located on the surface of the target layer 202, and the dimension of the etching spacer 203 may be smaller than the dimension of the target layer 202.

In another embodiment, there are a plurality of target layers (greater than or equal to 2) and a plurality of etching spacers (greater than or equal to 2) corresponding to the plurality of target layers, and each of the etching spacers is located on the surface of a respective one of the target layers.

Figure 5:
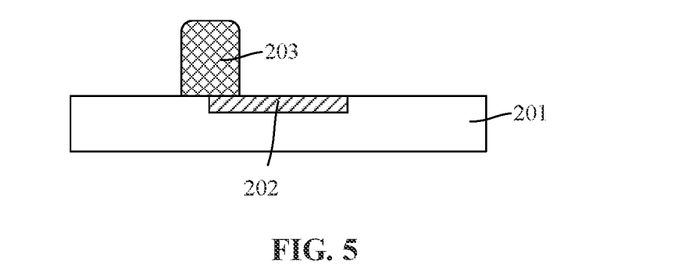

In another embodiment, there are at least one target layer and at least one etching spacer corresponding to the at least one target layer. A portion of each of the at least one etching spacer is located on a portion of the surface of a respective one of the at least one target layer and another portion of each of the at least one etching spacer is located on a surface of the substrate on a side of said respective one of the at least one target layer. Referring to FIG. 5, one target layer 202 and one etching spacer 203 are illustrated as an example. A portion of the etching spacer 203 is located on a portion of the surface of the target layer 202 and another portion of the etching spacer 203 is located on a surface of the substrate 201 on a side of the target layer 202. Due to such a design of the etching spacer 203, even if the etching hole subsequently formed in the dielectric layer is greatly offset, the bottom of the etching hole can still expose the surface of the etching spacer. After the etching spacer is removed to form an etching channel, the etching hole can still communicate with the etching channel. When the metal plug is formed in the contact window structure, the metal plug can communicate with the corresponding target layer.

Figure 6:
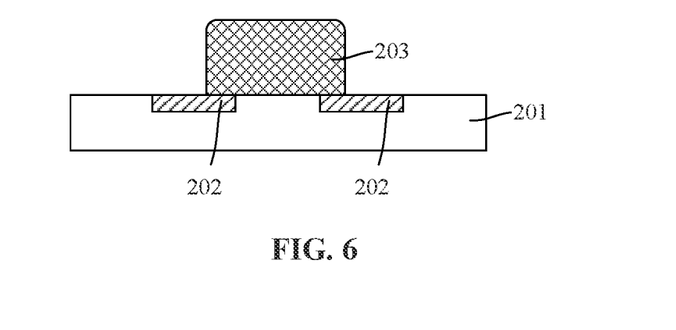

In yet another embodiment, there are a plurality of target layers and one etching spacer, the etching spacer spans surfaces of the plurality of target layers (and the surface of the substrate between the plurality of target layers), and the etching channel formed by removing the etching spacer exposes a portion of the surface of each of the plurality of target layers (and the surface of the substrate between adjacent target layers). Referring to FIG. 6, two target layers 202 and one etching spacer 203 are illustrated as an example in FIG. 6. The two discrete target layers 202 are located in the substrate 201, and the etching spacer 203 spans surfaces of the two target layers 202 (and the surface of the substrate 201 between the two target layers 202). After an etching hole exposing the surface of the etching spacer 203 is formed in the dielectric layer and the etching spacer is removed to form an etching channel communicating with the etching hole, the etching through hole can simultaneously expose a portion of the surface of each of the plurality of target layers. That is, the formed etching window structure can simultaneously expose a portion of the surface of each of the plurality of target layers. When a metal plug is formed in the etching window structure, the formed metal plug may be electrically connected to each of the plurality of target layers. Such a connection manner is simple in forming process and is beneficial to improvement of the integration level.

Figure 7:
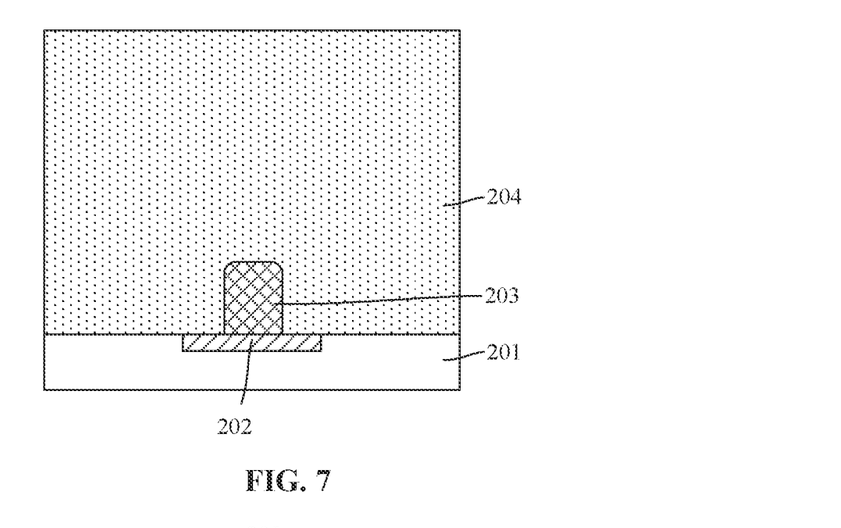

Referring to FIG. 7, a dielectric layer 204 covering the substrate 201, the target layer 202 and the etching spacer 203 is formed.

The material of the dielectric layer 204 and the material of the etching spacer 203 are different from each other. The dielectric layer 204 is made of one of silicon nitride, silicon oxide, silicon oxynitride, or silicon oxynitride.

The dielectric layer 204 is formed by chemical vapor deposition. In an embodiment, the dielectric layer 204 may be planarized by a planarization process, so that the dielectric layer 204 has a planar surface. The planarization process may be a chemical mechanical polishing process.

Figure 8:
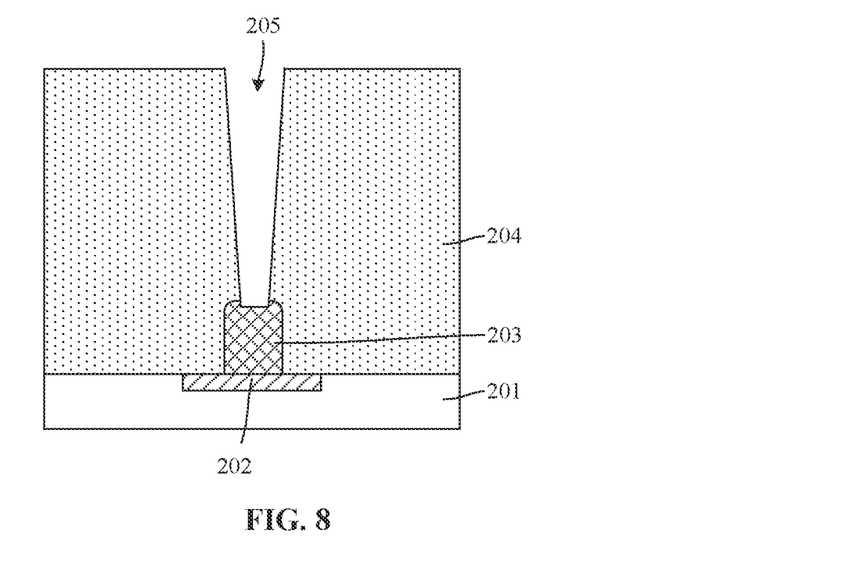

Referring to FIG. 8, the dielectric layer 204 is etched to form an etching hole 205 in the dielectric layer 204. A bottom of the etching hole 205 exposes a top surface of the etching spacer 203, and a dimension of the bottom of the etching hole 205 is smaller than a dimension of a top of the etching spacer 203.

In an embodiment, before the dielectric layer 204 is etched, a patterned mask layer (such as a patterned photoresist layer or a stacked structure of a patterned hard mask layer and a photoresist layer) is formed on the dielectric layer 204. The dielectric layer 204 is etched with the patterned mask layer as a mask. An etching hole 205 exposing the top surface of the etching spacer 203 is formed in the dielectric layer 204.

The etching hole 205 formed in the dielectric layer 204 still has a high aspect ratio, so that the dimension of the top of the formed etching hole is greater than the dimension of the bottom of the formed etching hole. That is, the dimension of the etching hole 205 is gradually reduced in a direction from an upper surface to a lower surface of the dielectric layer 204. In other embodiments, the dimensions of the top and the bottom of the etching hole 205 may be the same.

In an embodiment, the dielectric layer 204 may be etched by using an anisotropic dry etching process, such as an anisotropic plasma etching process. The dielectric layer 204 has a higher etching selectivity than the etching spacer 203 when the dielectric layer 204 is etched to form the etching hole 205. Specifically, the etching selectivity is greater than or equal to 2:1. During the formation of the etching hole 205, due to a support effect of the etching spacer 203, when the contact window structure with the same depth as the existing contact window structure is formed, the depth of the etching hole 205 formed in the present application can be reduced. When the etching hole with a smaller depth is formed, the etching spacer 203 can be used as an etching stop layer, so that a problem of not windowing can be prevented, and a problem of increasing etching strength does not exist during formation of a contact window structure. Therefore, a dimension of a top of the etching hole cannot be increased and can be kept consistent with a designed dimension, and the etching difficulty for forming the etching hole 205 can be reduced.

Figure 9:
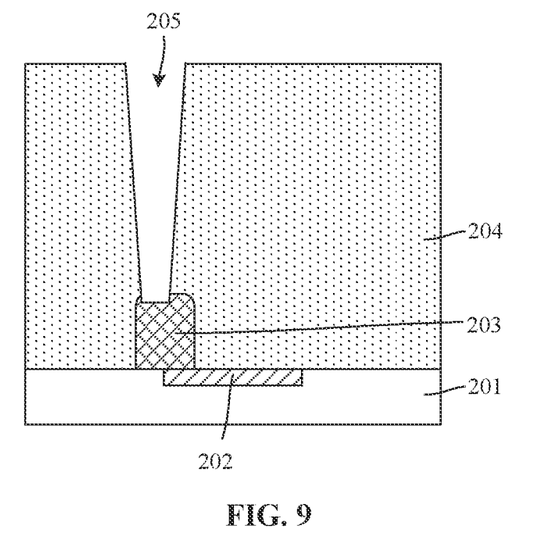

In an embodiment, referring to FIG. 9, FIG. 9 is a schematic diagram of a formed etching hole 205 which is greatly offset. The etching hole 205 can still expose the surface of the etching spacer 203 when the etching hole 205 is greatly offset.

Figure 10:
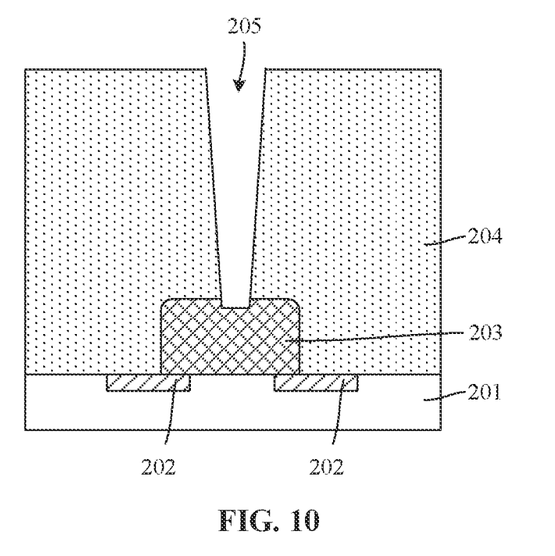

In an embodiment, referring to FIG. 10, the etching hole 205 formed in FIG. 10 exposes a portion of the surface of the etching spacer 203, and the etching spacer 203 spans the surfaces of the plurality of target layers 202. Therefore, an etching channel communicating with the etching hole 205 formed through subsequent removal of the etching spacer exposes the partial surfaces of the plurality of target layers (and a substrate surface between adjacent target layers).

Figure 11:
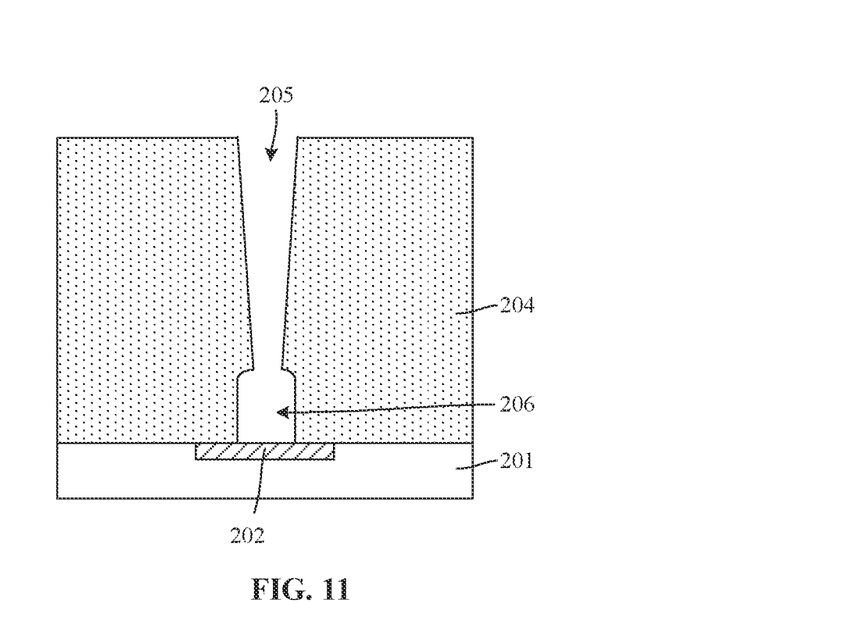

Referring to FIG. 11, the etching spacer 203 is removed along the etching hole to form an etching channel 206 communicating with the etching hole 205. The etching channel 206 exposes a portion of the surface of the target layer 202. The etching channel 206 constitutes a contact window structure with the etching hole 205.

The etching spacer 203 may be removed by using an isotropic wet etching process. When the etching spacer is removed, the etching spacer has a higher etching selectivity than the dielectric layer. Specifically, the etching selectivity may be greater than or equal to 5:1, so that the etching amount of a side wall of the formed etching hole 205 in the etching process may be negligible or small, so as to prevent the dimension increase or small change of the etching hole 205.

The etching channel 206 and the etching hole 205 constitute a contact window structure. The contact window structure has a high aspect ratio. In a specific embodiment, the aspect ratio of the contact window structure is greater than 5:1, and may specifically be 8:1, 10:1, or 20:1 (the depth of the contact window structure is a total depth of the etching channel 206 and the etching hole 205, and the width of the contact window structure is a width of the top of the etching hole 205).

When the etching spacer 203 is removed, the height of the etching spacer 203 may be smaller than (far smaller than) the depth of a contact window structure to be formed, so that an etching load for removing the etching spacer 203 is smaller, and excessive over-etching will not be brought to the target layer 202. Moreover, since the dimension of the etching spacer 203 is larger than the dimension of the bottom of the etching hole 205, after the etching spacer is removed, the dimension of the formed etching channel 206 is also larger than the dimension of the bottom of the etching hole 205. That is, the dimension of the bottom of the contact window structure is increased. When a metal plug is subsequently formed in the contact window structure, the metal plug and the target layer have a larger contact area, and thus the contact resistance is reduced. In addition, the etching spacer is arranged to extend laterally relative to the target layer. Thus, even if the position of the etching hole formed in the dielectric layer is slightly offset due to design layout limitations, the bottom of the etching hole still exposes a portion of the surface of the etching spacer, so that the etching hole communicates with an etching channel formed after the etching spacer is removed. The metal plug connected to the target layer can still be formed in the contact window structure.

Figure 12:
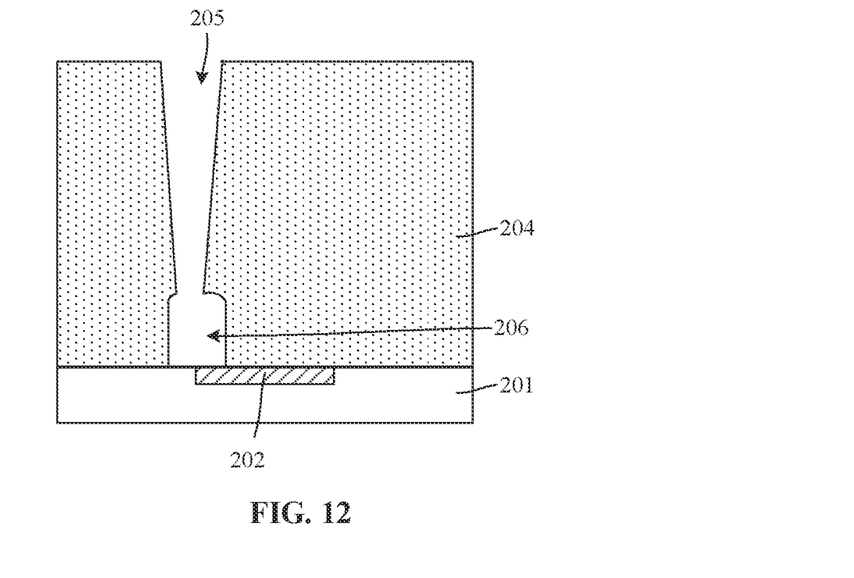

In an embodiment, referring to FIG. 12, FIG. 12 is a schematic diagram of a formed etching hole 205 which is greatly shifted. When the etching hole 205 is greatly offset, the formed etching hole 205 can still communicate with the etching channel 206 formed after the etching spacer 203 is removed.

Figure 13:
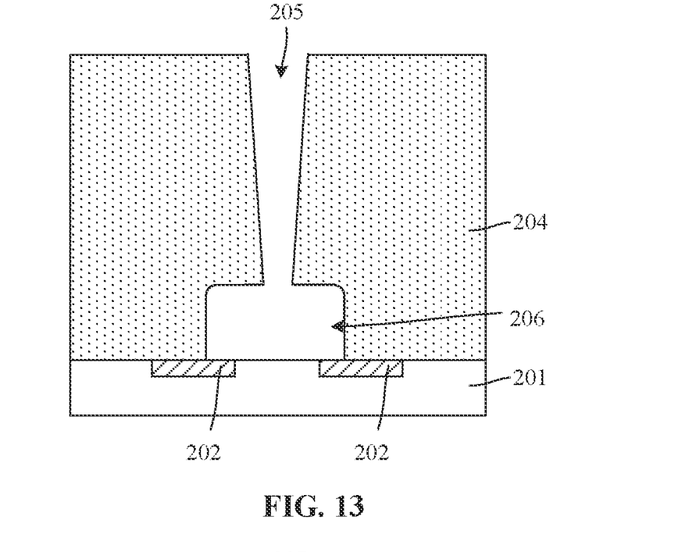

In an embodiment, referring to FIG. 13, the etching channel 206 communicating with the etching hole 205 formed through removal of the etching spacer exposes a portion of the surface of each of the plurality of target layers 202 (and the surface of the substrate between adjacent target layers) in FIG. 13.

Figure 14:
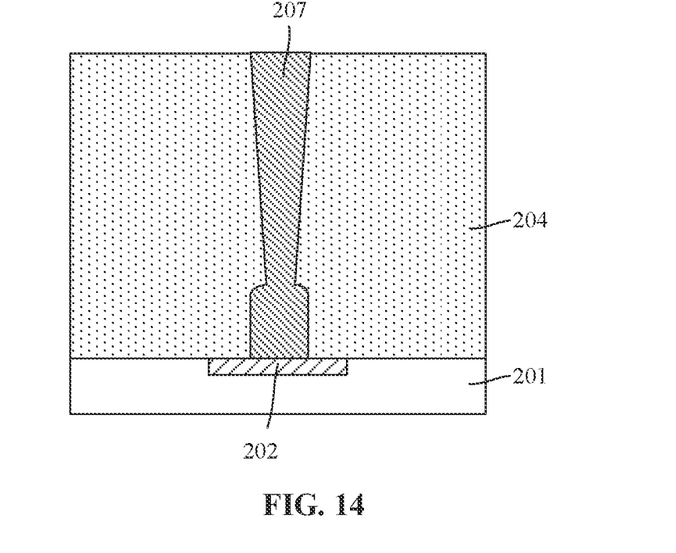
Figure 15:
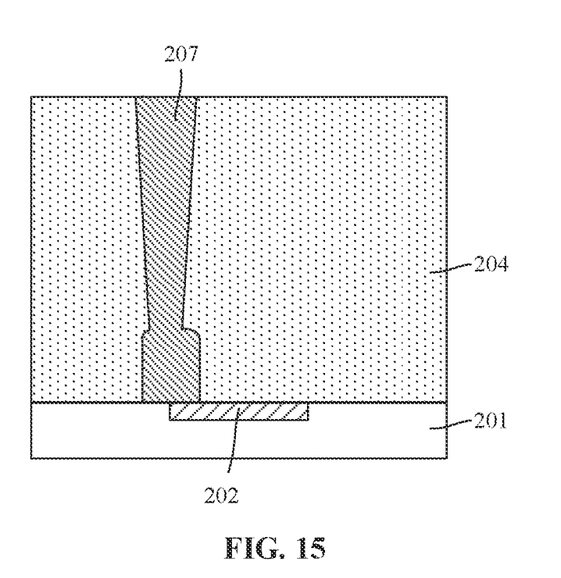
Figure 16:
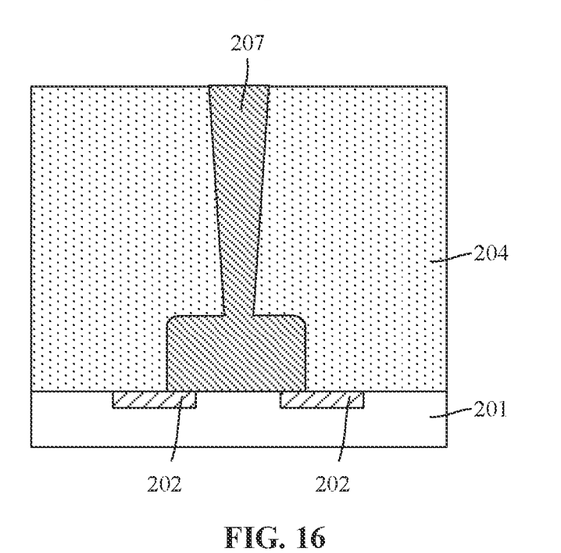

Referring to FIG. 14 to FIG. 16, the contact window structure is filled with metal to form a contact plug 207.

The contact plug 207 may be made of metal or other suitable conductive materials.

In an embodiment, the operation that the contact plug 207 is formed includes the following operations. A conductive material layer is formed on the surfaces of the contact window structure and the dielectric layer 204. The contact window structure is filled with the conductive material layer. The conductive material layer may be made of metal (such as W). The conductive material layer is formed through a sputtering process. The conductive material layer above the surface of the dielectric layer 204 is removed by using a chemical mechanical polishing process to form a contact plug in the contact window structure.

In other embodiments, a capacitive structure may also be formed in the contact window structure.

An embodiment of the present application also provides a contact window structure of a semiconductor device. Referring to FIG. 11, FIG. 12, or FIG. 13, the semiconductor device includes: a substrate 201, a dielectric layer 204, and a contact window structure.

The substrate 201 is provided with a target layer 202 formed therein, and the substrate 201 exposes a surface of the target layer.

The dielectric layer 204 is located on the substrate 201 and the target layer 202.

The contact window structure is located in the dielectric layer 204, and includes an etching hole 205 and an etching channel 206 communicating with the etching hole 205. The etching hole 205 is located above the etching channel 206. The etching channel 206 exposes a portion of the surface of the target layer 202, and the etching channel 206 is formed by removing an etching spacer 203 (referring to FIG. 8, 9, or 10) on the surface of the target layer 202 after the etching hole 205 is formed in the dielectric layer 204.

It should be noted that the definition or description of similar or identical structures in the present embodiment (the contact window structure) as in the previous embodiment (the formation process of the contact window structure) is not limited in the present embodiment, with particular reference to the definition or description of corresponding parts of the previous embodiment.

Although the present application has been disclosed in terms of some embodiments, it is not intended to limit the present application. Any person skilled in the art, without departing from the spirit and scope of the present application, may make possible variations and modifications to the technical solution of the present application using the methods and techniques disclosed above. Therefore, any simple modifications, equivalent variations and modifications made on the above embodiment according to the technical essence of the present application without departing from the content of the technical solution of the present application fall within the scope of protection of the technical solution of the present application.

The invention claimed is:

1. A method for forming a contact window structure of a semiconductor device, comprising:
providing a substrate, provided with at least one target layer formed in the substrate and exposing a surface of the target layer;

forming at least one etching spacer on the surface of the target layer;

forming a dielectric layer covering the substrate, the target layer and the etching spacer;

etching the dielectric layer to form an etching hole in the dielectric layer, a bottom of the etching hole exposing a top surface of the etching spacer; and removing the etching spacer along the etching hole to form an etching channel communicating with the etching hole, the etching channel exposing a portion of the surface of the target layer and constituting the contact window structure with the etching hole.

2. The method for forming the contact window structure of the semiconductor device of claim 1, wherein a material of the etching spacer and a material of the dielectric layer are different from each other.

3. The method for forming the contact window structure of the semiconductor device of claim 2, wherein the dielectric layer has a higher etching selectivity than the etching spacer when the dielectric layer is etched to form the etching hole.

4. The method for forming the contact window structure of the semiconductor device of claim 2, wherein the etching spacer has a higher etching selectivity than the dielectric layer when the etching spacer is removed.

5. The method for forming the contact window structure of the semiconductor device of claim 1, wherein a dimension of the bottom of the etching hole is smaller than a dimension of a top of the etching spacer.

6. The method for forming the contact window structure of the semiconductor device of claim 1, wherein forming the etching spacer comprises: forming an etching spacer material layer on the target layer and the substrate; and patterning the etching spacer material layer to form the etching spacer on the target layer.

7. The method for forming the contact window structure of the semiconductor device of claim 1, wherein a height of the etching spacer is 1%-30% of a depth of the contact window structure.

8. The method for forming the contact window structure of the semiconductor device of claim 1, wherein there is one target layer, and the etching spacer is located on the surface of the target layer.

9. The method for forming the contact window structure of the semiconductor device of claim 1, wherein there are a plurality of target layers and a plurality of etching spacers corresponding to the plurality of target layers, and each of the etching spacers is located on the surface of a respective one of the target layers.

10. The method for forming the contact window structure of the semiconductor device of claim 1, wherein a portion of each of the at least one etching spacer is located on a portion of the surface of a respective one of the at least one target layer and another portion of each of the at least one etching spacer is located on a surface of the substrate on a side of said respective one of the at least one target layer.

11. The method for forming the contact window structure of the semiconductor device of claim 1, wherein there are a plurality of target layers and one etching spacer, the etching spacer spans surfaces of the plurality of target layers, and the etching channel formed by removing the etching spacer exposes a portion of the surface of each of the plurality of target layers.

12. The method for forming the contact window structure of the semiconductor device of claim 1, further comprising: filling the contact window structure with metal to form a contact plug.

13. A contact window structure of a semiconductor device, formed by the method according to claim 1.

* * * * *